(12) United States Patent
Han et al.

(10) Patent No.: US 11,769,737 B2
(45) Date of Patent: Sep. 26, 2023

(54) SEMICONDUCTOR PACKAGE

(71) Applicant: SAMSUNG ELECTRONICS CO., LTD., Suwon-si (KR)

(72) Inventors: Junghoon Han, Hwaseong-si (KR); Jongmin Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/319,232

(22) Filed: May 13, 2021

(65) Prior Publication Data

US 2022/0115333 A1 Apr. 14, 2022

(30) Foreign Application Priority Data

Oct. 13, 2020 (KR) ........................ 10-2020-0131737

(51) Int. Cl.
| | |
|---|---|
| *H01L 23/00* | (2006.01) |
| *H01L 23/31* | (2006.01) |
| *H01L 23/13* | (2006.01) |
| *H01L 23/498* | (2006.01) |
| *H01L 21/48* | (2006.01) |
| *H01L 21/56* | (2006.01) |

(52) U.S. Cl.
CPC ........ *H01L 23/562* (2013.01); *H01L 21/4853* (2013.01); *H01L 21/563* (2013.01); *H01L 23/13* (2013.01); *H01L 23/3157* (2013.01); *H01L 23/49838* (2013.01); *H01L 23/49894* (2013.01); *H01L 24/16* (2013.01); *H01L 2224/16227* (2013.01); *H01L 2924/18161* (2013.01); *H01L 2924/3512* (2013.01)

(58) Field of Classification Search
None
See application file for complete search history.

(56) References Cited

U.S. PATENT DOCUMENTS

| | | | |
|---|---|---|---|
| 10,535,534 B2 | 1/2020 | Kang et al. | |
| 10,541,201 B2 | 1/2020 | Lee et al. | |
| 10,665,571 B2 | 5/2020 | Lee | |
| 2010/0081236 A1 | 4/2010 | Yang et al. | |
| 2018/0102298 A1 | 4/2018 | Chen et al. | |
| 2020/0075569 A1 | 3/2020 | Jeng et al. | |
| 2020/0091029 A1* | 3/2020 | Jeng | ........................ H01L 23/36 |
| 2020/0098678 A1 | 3/2020 | Tajima et al. | |

* cited by examiner

*Primary Examiner* — Long Pham
(74) *Attorney, Agent, or Firm* — Lee IP Law, P.C.

(57) ABSTRACT

A semiconductor package includes an upper conductive pattern and a redistribution layer on a first surface of a substrate, a semiconductor chip facing the first surface of the substrate, the semiconductor chip being spaced apart from the first surface of the substrate, a conductive bump bonding between the semiconductor chip and the upper conductive pattern, the conductive bump electrically connecting the semiconductor chip and the upper conductive pattern, and an upper passivation layer on the redistribution layer, a portion of the upper passivation layer facing an edge of a lower surface of the semiconductor chip.

20 Claims, 14 Drawing Sheets

SEMICONDUCTOR PACKAGE

CROSS-REFERENCE TO RELATED APPLICATION

Korean Patent Application No. 10-2020-0131737, filed on Oct. 13, 2020, in the Korean Intellectual Property Office, and entitled: "Semiconductor Package," is incorporated by reference herein in its entirety.

BACKGROUND

1. Field

Example embodiments relate to a semiconductor package. Particularly, example embodiments relate to a semiconductor package including a semiconductor chip bonded on an interposer substrate.

2. Description of the Related Art

A semiconductor package may include a package substrate, an interposer substrate, a semiconductor chip, and conductive bumps. The semiconductor chip may be bonded on a first surface of the interposer substrate.

SUMMARY

According to example embodiments, there is provided a semiconductor package that may include an upper conductive pattern and a redistribution layer on a first surface of a substrate, a semiconductor chip spaced apart from the first surface of the substrate, a conductive bump for bonding between the semiconductor chip and the upper conductive pattern, and an upper passivation layer on the redistribution layer. The semiconductor chip may be disposed to face the first surface of the substrate. The conductive bump may be electrically connected to the semiconductor chip and the upper conductive pattern. A portion of the upper passivation layer may be disposed to face an edge of a lower surface of the semiconductor chip.

According to example embodiments, there is provided a semiconductor package that may include an upper conductive pattern and a redistribution layer on a first surface of an interposer substrate, a first bump pad on the upper conductive pattern, a semiconductor chip spaced apart from the first surface of the interposer substrate, a conductive bump interposed between the first and second bump pads, a lower passivation layer conformally on the first surface of the interposer substrate, a sidewall of the upper conductive pattern, and sidewalls and an upper surface of the redistribution layer, and an upper passivation layer on the redistribution layer. The semiconductor chip may be disposed to face the first surface of the interposer substrate. The semiconductor chip may include a second bump pad. The conductive bump may bond between the semiconductor chip and the upper conductive pattern. The conductive bump may be electrically connected to the semiconductor chip and the upper conductive pattern. A portion of the upper passivation layer may be disposed to face an edge of a lower surface of the semiconductor chip. A width of a portion where the upper passivation layer and a lower surface of the semiconductor chip face each other may be less than about 1 mm.

According to example embodiments, there is provided a semiconductor package that may include a package substrate including a lower conductive pattern, an interposer substrate disposed on the package substrate, an upper conductive pattern and a redistribution layer on a first surface of the interposer substrate, a semiconductor chip spaced apart from the first surface of the interposer substrate, a conductive bump for bonding between the semiconductor chip and the upper conductive pattern, an upper passivation layer on the redistribution layer, a lower insulation layer filling a gap between the semiconductor chip and the first surface of the interposer substrate, a connection member electrically connecting the interposer substrate and the package substrate. The semiconductor chip may be disposed to face the first surface of the interposer substrate. The conductive bump may be electrically connected to the semiconductor chip and the upper conductive pattern. A portion of the upper passivation layer may be disposed to face an edge of a lower surface of the semiconductor chip. The lower insulation layer may contact an upper surface of a portion of the upper passivation layer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
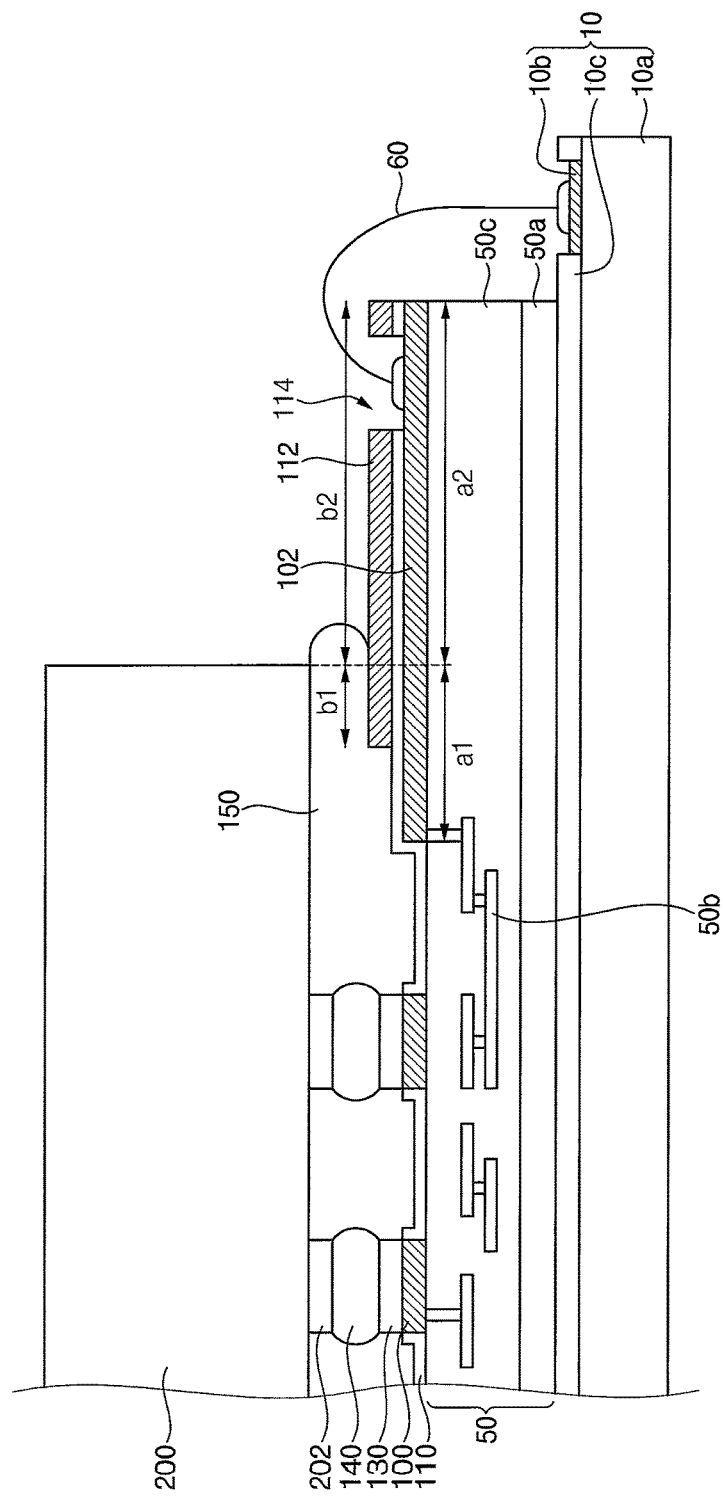
FIG. 1 is a cross-sectional view of a semiconductor package in accordance with example embodiments.
Figure 2:
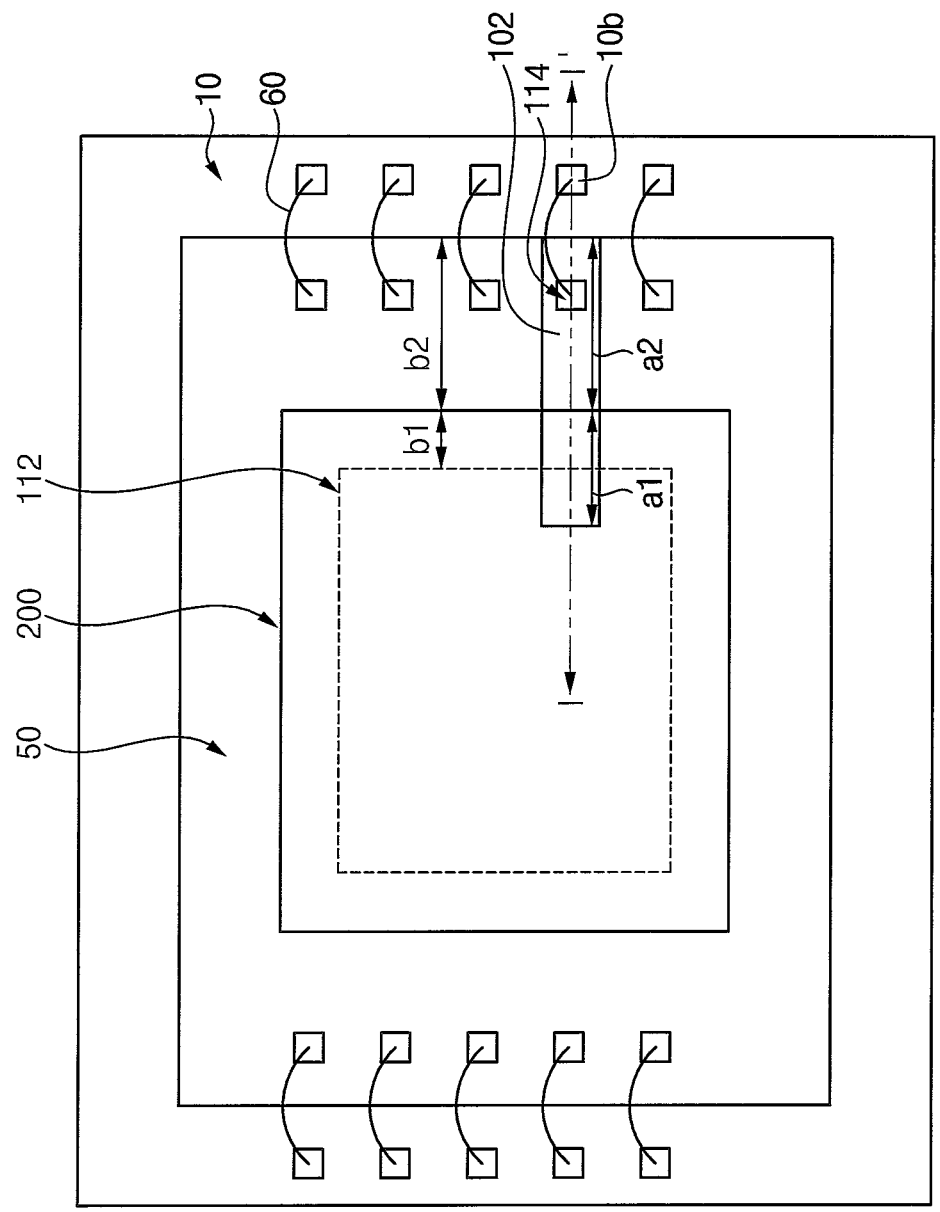
FIG. 2 is a plan view of a semiconductor package in accordance with example embodiments.
Figure 3:
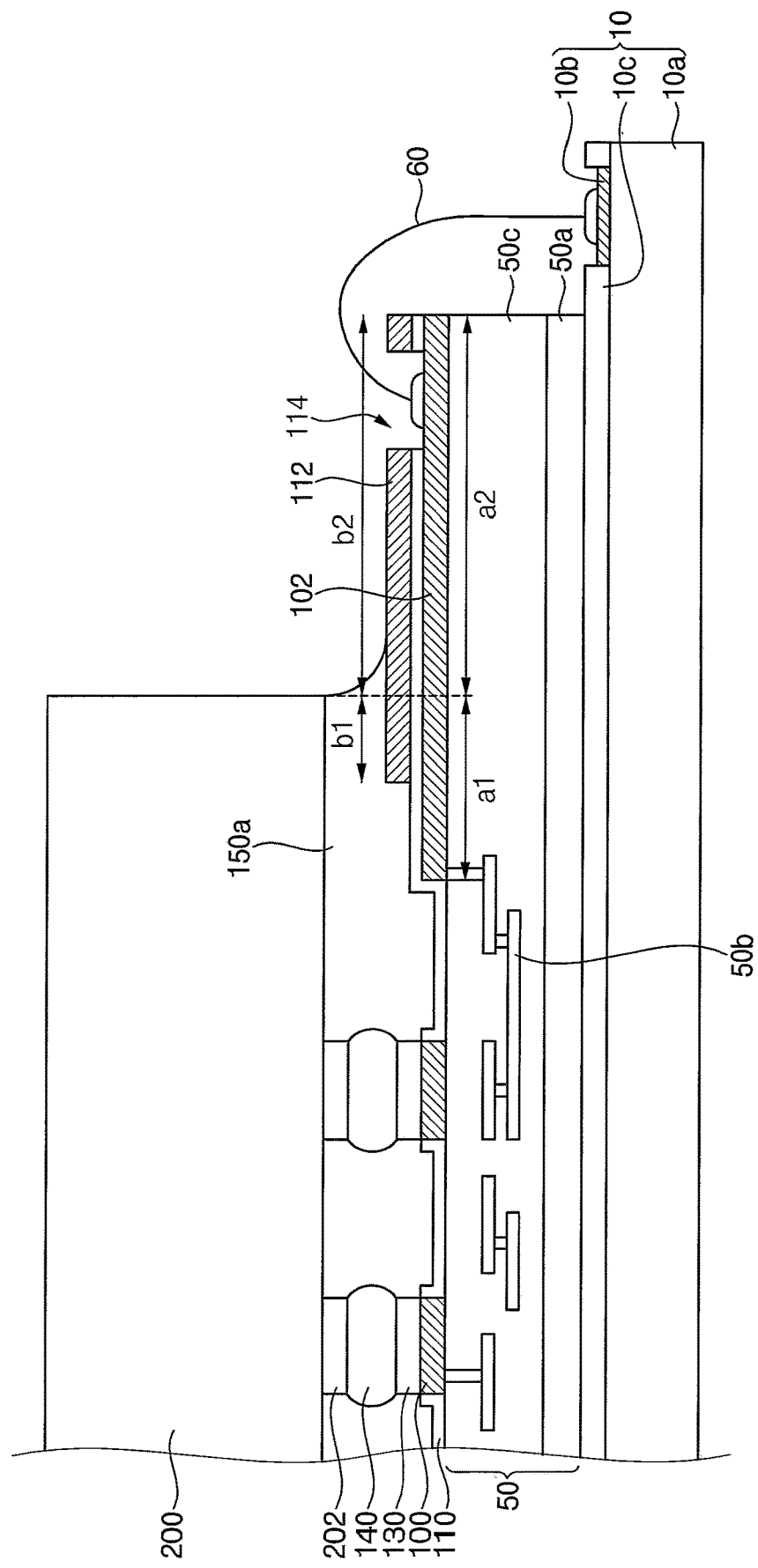
FIG. 3 is a cross-sectional view of a semiconductor package in accordance with some example embodiments.

FIG. 1 is a cross-sectional view of a semiconductor package in accordance with example embodiments. FIG. 2 is a plan view of a semiconductor package in accordance with example embodiments. FIG. 3 is a cross-sectional view of a semiconductor package in accordance with some example embodiments.

The semiconductor packages shown in FIGS. 1 and 3 may be substantially the same, except for a lower insulation layer. FIGS. 1 and 3 are cross-sectional views taken along line I-I' of FIG. 2. In FIG. 2, only the main elements are briefly shown, and some elements are omitted. Hereinafter, a semiconductor package in accordance with example embodiments will be described with reference to FIGS. 1 to 3.

Referring to FIGS. 1 to 3, the semiconductor package may include a package substrate 10, an interposer substrate 50, a semiconductor chip 200, a conductive bump 140, a redistribution layer 102, a lower passivation layer 110, an upper passivation layer 112, and a lower insulation layer 150.

The package substrate 10 may be a support substrate on which a semiconductor package is mounted. The package substrate 10 may include a body part 10a, and a base passivation layer 10c with a first upper conductive pattern 10b formed on an upper surface of the body part 10a. The base passivation layer 10c may not be formed on the first upper conductive pattern 10b, so that an upper surface of the first upper conductive pattern 10b may be exposed. In example embodiments, the package substrate 10 may be, e.g., a printed circuit board (PCB) substrate.

The interposer substrate 50 may include metal wirings 50b and intermetal dielectric layers 50c formed on a silicon-based substrate 50a. The interposer substrate 50 may be disposed between the semiconductor chip 200 and the package substrate 10. The semiconductor chip 200 and the package substrate 10 may be electrically connected to each other by the metal wirings 50b included in the interposer substrate 50, so wiring circuits of the semiconductor package may be simplified. Thus, the speed for data transmission and reception in the semiconductor package may be increased.

The interposer substrate 50 may have a first surface and a second surface opposite to the first surface. The second surface of the interposer substrate 50 may be attached to an upper surface of the package substrate 10. For example, the second surface of the interposer substrate 50 may be attached to the upper surface of the package substrate 10 using an adhesive, e.g., a die attach film (DAF).

The semiconductor chip 200 may be disposed to face the first surface of the interposer substrate 50. The semiconductor chip 200 may be spaced apart from the first surface of the interposer substrate 50, e.g., along a vertical direction. A second upper conductive pattern 100 and the redistribution layer 102 may be formed on the first surface of the interposer substrate 50. The metal wiring 50b in the interposer substrate 50 may be electrically connected to the second upper conductive pattern 100 and the redistribution layer 102. A first bump pad 130 may be disposed on the second upper conductive pattern 100.

The semiconductor chip 200 may include a memory device, e.g., flash memory, dynamic random access memory (DRAM), static random access memory (SRAM), electrically erasable programmable read-only memory (EEPROM), phase change random access memory (PRAM), magnetoresistive random access memory (MRAM), resistive random access memory (ReRAM), high bandwidth memory (HBM), and hybrid memory cubic (HMC), system large scale integration (LSI), logic circuit, an image sensor, e.g., a complementary metal oxide semiconductor (CMOS), a contact imaging sensor (CIS), or a microelectromechanical system (MEMS) device. The semiconductor chip 200 may include a main portion of a chip and a second bump pad 202 disposed on a lower surface of the main portion of the chip.

The conductive bump 140 may be interposed between the first bump pad 130 and the second bump pad 202, so that the first bump pad 130 and the second bump pad 202 may be bonded to each other by the conductive bump 140. Thus, the semiconductor chip 200 and the interposer substrate 50 under the first bump pad 130 may be bonded to each other.

The redistribution layer 102 may serve as a connection member for electrically connecting the semiconductor chip 200 and the first upper conductive pattern 10b in the package substrate 10. The redistribution layer 102 may extend from a portion facing a lower surface of the semiconductor chip 200 to a portion not facing the semiconductor chip 200, e.g., the redistribution layer 102 may overlap a portion of the lower surface of the semiconductor chip 200 and extend continuously in a horizontal direction beyond the semiconductor chip 200. For example, the redistribution layer 102 may extend from a portion under an edge of the semiconductor chip 200 to an outside of the semiconductor chip 200. Hereinafter, a portion of the redistribution layer 102 facing, e.g., overlapping, the lower surface of the semiconductor chip 200 is referred to as a first portion a1 of the redistribution layer 102, and the portion of the redistribution layer 102 not facing the semiconductor chip 200 is referred to as a second portion a2 of the redistribution layer 102. For example, as illustrated in FIG. 1, the first and second portions a1 and a2 of the redistribution layer 102 may be continuous with each other and overlap different parts of the interposer substrate 50.

When a thickness of the redistribution layer 102 is increased, a resistance of the redistribution layer 102 may be decreased. Therefore, the thickness of the redistribution layer 102 may be increased so as to have a high operating speed of the semiconductor package. However, when the thickness of the redistribution layer 102 is increased, defects, e.g., cracks in the redistribution layer 102 due to external stress, may occur. In addition, when the thickness of the redistribution layer 102 is increased, downsizing of the package may be difficult.

In example embodiments, the redistribution layer 102 may have a thickness of about 2.5 μm to about 4.1 μm. In example embodiments, the redistribution layer 102 may include a metal, e.g., copper (Cu), aluminum (Al), silver (Ag), tin (Sn), gold (Au), nickel (Ni), lead (Pb), titanium (Ti), or an alloy thereof, etc.

The second upper conductive pattern 100 may be disposed to face the lower surface of the semiconductor chip 200. The second upper conductive pattern 100 may be electrically connected to devices included in the semiconductor chip 200. In example embodiments, the second upper conductive pattern 100 may include the same material as the redistribution layer 102. Further, the second upper conductive pattern 100 may have a same thickness as a thickness of the redistribution layer 102.

The lower passivation layer 110 may be conformally formed on the first surface of the interposer substrate 50, a sidewall of the second upper conductive pattern 100, and a sidewall and an upper surface of the redistribution layer 102. The lower passivation layer 110 may not be formed on the upper surface of the second upper conductive pattern 100.

In example embodiments, the lower passivation layer 110 may include silicon oxide, silicon nitride, silicon oxynitride, or the like. For example, the lower passivation layer 110 may include silicon nitride. In example embodiments, the lower passivation layer 110 may have a first thickness in a range of about 0.3 μm to about 0.8 μm.

The upper passivation layer 112 may be formed on the lower passivation layer 110 positioned on the upper surface of the redistribution layer 102, e.g., the lower passivation layer 110 may be between the upper passivation layer 112 and the redistribution layer 102. The upper passivation layer 112 may cover, e.g., only, a portion of the first portion a1 of the redistribution layer 102 and the second portion a2 of the redistribution layer 102. Hereinafter, a portion of the upper passivation layer 112 facing, e.g., overlapping, the lower surface of the semiconductor chip 200 is referred to as a third portion b1 of the upper passivation layer 112, and a portion of the upper passivation layer 112 not facing the lower surface of the semiconductor chip 200 is referred to as a fourth portion b2 of the upper passivation layer 112. For example, as illustrated in FIG. 1, the third and fourth portions b1 and b2 of the upper passivation layer 112 may be continuous with each other and overlap different parts of the redistribution layer 102.

The third portion b1 of the upper passivation layer 112 may cover an edge of the first portion of the redistribution layer 102. Therefore, a structure in which the redistribution layer 102, the lower passivation layer 110, and the upper passivation layer 112 are stacked, e.g., along a vertical direction, may be formed on a portion of the interposer substrate 50 facing, e.g., overlapping, an end portion of the lower surface of the semiconductor chip 200.

In example embodiments, a width of the third portion b1 of the upper passivation layer 112 may be less than 1 mm, e.g., a length in a horizontal direction of an overlap region between the upper passivation layer 112 and the semiconductor chip 200 may be less than 1 mm. When the width of the third portion b1 of the upper passivation layer 112 is greater than or equal to 1 mm, an overlap portion of the upper passivation layer 112 and the lower surface of the semiconductor chip 200 may be increased. Thus, forming of the lower insulation layer 150 may not be easy.

The upper passivation layer 112 may include an insulating material having ductility. The upper passivation layer 112 may have a ductility higher than a ductility of the lower passivation layer 110. Therefore, stress applied to the redistribution layer 102 may be effectively decreased by the upper passivation layer 112.

The upper passivation layer 112 may be a photosensitive solder resist (PSR) layer. The photosensitive solder resist may include a photosensitive polymer. The photosensitive polymer may include at least one of a photosensitive polyimide (PSPI), polybenzoxazole (PBO), a phenolic polymer, and a benzocyclobutene polymer (BCB). For example, the upper passivation layer 112 may include photosensitive polyimide.

The upper passivation layer 112 may have a second thickness greater than the first thickness of the lower passivation layer 110, e.g., along the vertical direction. In example embodiments, the upper passivation layer 112 may have a thickness of about 4 µm to about 6 µm.

The upper passivation layer 112 may cover a part of the first portion a1 of the redistribution layer 102 and a part of the second portion a2 of the redistribution layer 102, so that the upper passivation layer 112 may protect the redistribution layer 102. That is, cracks in the redistribution layer 102 due to thermal stress applied to the redistribution layer 102 may be decreased by the upper passivation layer 112.

A gap may be formed between the lower surface of the semiconductor chip 200 and the upper surface of the interposer substrate 50 in a direction perpendicular from the upper surface of the interposer substrate 50. That is, the gap may be formed around a portion where the first bump pad 130, the conductive bump 140, and the second bump pad 202 are stacked, in a portion between a bonded semiconductor chip 200 and the interposer substrate 50. In example embodiments, the gap may have a vertical height of about 30 µm to about 40 µm.

The gap may have a first vertical height at a center portion where the redistribution layer 102 is not formed on the interposer substrate 50, e.g., the first vertical height of the gap may be measured from the lower surface of the semiconductor chip 200 to the upper surface of the lower passivation layer 110 in a region where the redistribution layer 102 is not formed. The gap may have a second vertical height less than the first vertical height at a portion between the redistribution layer 102 not covered by the upper passivation layer 112 and the semiconductor chip 200, e.g., the second vertical height of the gap may be measured from the lower surface of the semiconductor chip 200 to the upper surface of the lower passivation layer 110 in a region where the redistribution layer 102 is formed. The gap may have a third vertical height less than the second vertical height at a portion between the redistribution layer 102 covered by the upper passivation layer 112 and the semiconductor chip 200, e.g., the third vertical height of the gap may be measured from the lower surface of the semiconductor chip 200 to the upper surface of the upper passivation layer 112.

Therefore, the first vertical height may be the highest vertical height of the gap. The first vertical height may be higher than a vertical height of the structure in which the redistribution layer 102, the lower passivation layer 110, and the upper passivation layer 112 are stacked.

The lower insulation layer 150 may be formed on at least the lower passivation layer 110 to fill the gap, e.g., the lower insulation layer 150 may completely fill the gap between the passivation layer 110 and the semiconductor chip 200. Thus, the lower insulation layer 150 may have a same height, e.g., thickness in the vertical direction, as that of the gap. The lower insulation layer 150 may have a vertical height of about 30 µm to about 40 µm.

Further, the lower insulation layer 150 may laterally protrude to the upper surface of the upper passivation layer 112 not facing a lower portion of the semiconductor chip 200 while filling the gap. For example, the lower insulation layer 150 may continuously extend on and overlap a portion of the upper passivation layer 112, e.g., the lower insulation layer 150 may extend beyond the semiconductor chip 200 while filling the gap. The lower insulation layer 150 may contact a portion of the upper surface of the upper passivation layer 112. That is, the lower insulation layer 150 may be formed on the lower passivation layer 110, and may, e.g., continuously, extend on the third portion b1 of the upper passivation layer 112 facing the lower surface of the semiconductor chip 200, and on the fourth portion b4 of the upper passivation layer 112 not facing the lower surface of the semiconductor chip 200.

In example embodiments, as shown in FIG. 1, the lower insulation layer 150 may include a non-conductive film (NCF). The NCF may be a material including an epoxy resin and a curing agent which are thermally curable and an organic elastic filler. In this case, the lower insulation layer 150 may fill the gap, and may laterally protrude from the gap to the upper surface of the upper passivation layer 112 not facing the lower portion of the semiconductor chip 200.

In some example embodiments, as shown in FIG. 3, a lower insulation layer 150a may be an underfill resin. The underfill resin may be, e.g., an epoxy adhesive. In this case, a sidewall of the lower insulation layer 150a may have a slope from the edge of the semiconductor chip 200. A lower surface of the lower insulation layer 150a may also cover a portion of the upper surface of the upper passivation layer 112 not facing the lower portion of the semiconductor chip 200.

As illustrated in FIGS. 1 to 3, pad opening 114 may pass through the lower passivation layer 110 and the upper passivation layer 112. The pad opening 114 may expose a portion of the second portion a2 of the redistribution layer 102.

As a portion of the upper passivation layer 112 may overlap the lower surface of the semiconductor chip 200, an entire upper surface of the second portion a2 of the redistribution layer 102, except for the pad opening 114, may be protected by the upper passivation layer 112. That is, the lower passivation layer 110 and the upper passivation layer 112 may cover the entire upper surface of the second portion a2 of the redistribution layer 102, except for the pad opening 114.

As such, the redistribution layer 102 may be covered by the lower insulation layer 150 and/or the upper passivation layer 112. A first structure, in which the lower passivation layer 110, the upper passivation layer 112, and the lower insulation layer 150 are stacked, may be disposed on a part of the first portion a1 of the redistribution layer 102 under the edge of the lower surface of the semiconductor chip 200. A second structure, in which the lower passivation layer 110 and the lower insulation layer 150 are stacked, may be disposed on another part of the first portion a1 of the redistribution layer 102. A third structure, in which the lower passivation layer 110 and the upper passivation layer 112 are stacked, may be disposed on the second portion a2 of the redistribution layer 102.

The second portion a2 of the redistribution layer 102 may be covered with the upper passivation layer 112 having a ductility, so that the second portion a2 of the redistribution layer 102 may be sufficiently protected by the upper passivation layer 112. The redistribution layer 102 may not have a portion covered with only the lower passivation layer 110.

The redistribution layer 102 may be protected by the lower insulation layer 150 and/or the upper passivation layer 112. Even if thermal stress is applied to the redistribution layer 102, the redistribution layer 102 may be protected by the lower insulation layer 150 and/or the upper passivation layer 112. Therefore, cracks in the redistribution layer 102 due to thermal stress may be decreased.

The redistribution layer 102 exposed by the pad opening 114, and the first upper conductive pattern 10b on the package substrate 10 may be electrically connected to each other by wires 60.

An encapsulation layer covering the package substrate 10 and the semiconductor chip 200 may be further formed on the package substrate 10. The encapsulation layer may include, e.g., an insulation resin such as an epoxy-based molding compound (EMC).

Figure 4:
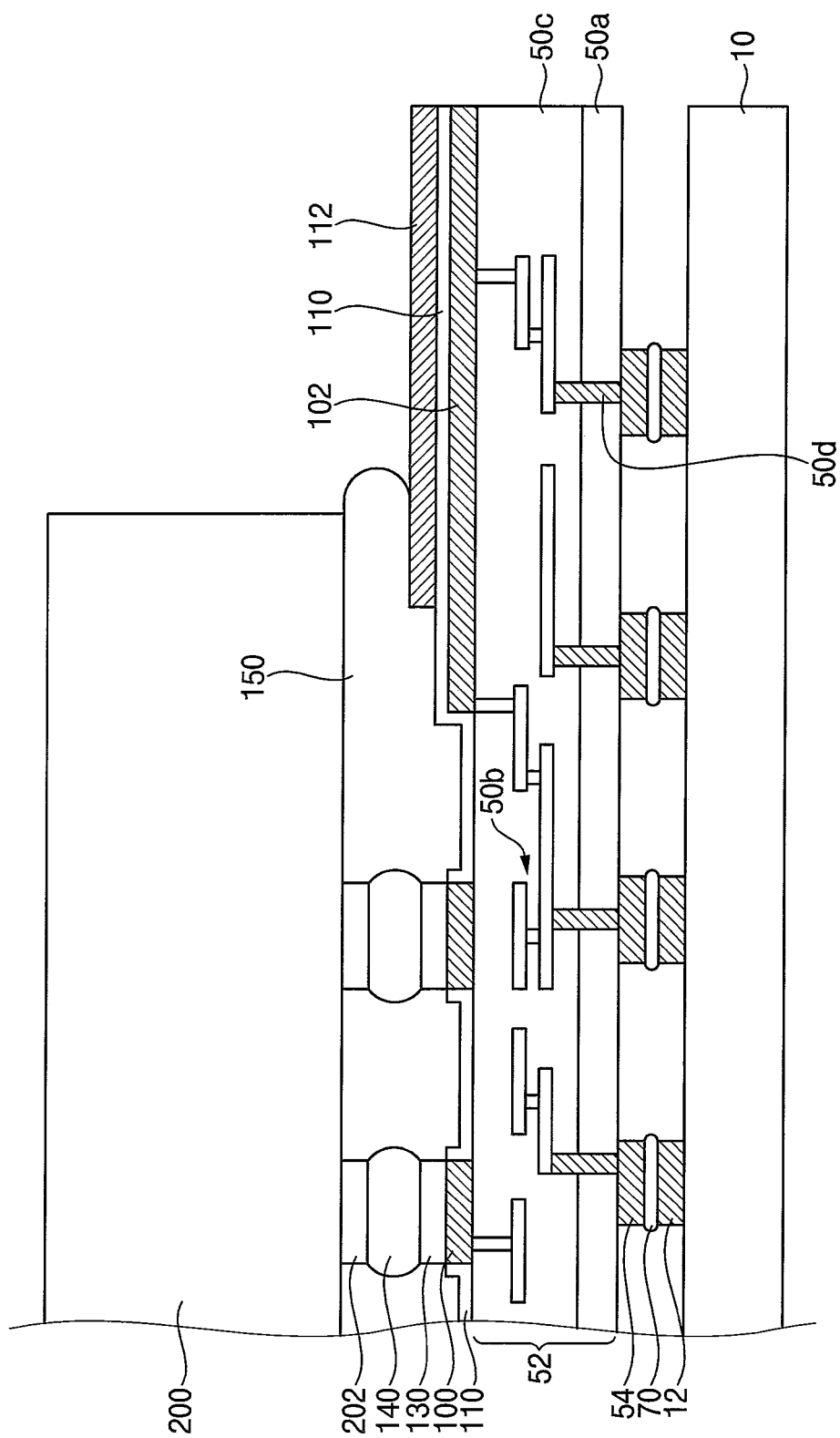
FIG. 4 is a cross-sectional view of a semiconductor package in accordance with example embodiments.

FIG. 4 is a cross-sectional view of a semiconductor package in accordance with example embodiments. The semiconductor package in FIG. 4 is similar to or the same as the semiconductor package in FIGS. 1 and 3, except for a through silicon via in an interposer substrate and a connection structure under the through silicon via. Therefore, redundant descriptions are omitted.

Referring to FIG. 4, the semiconductor package may include the package substrate 10, an interposer substrate 52, the semiconductor chip 200, the conductive bump 140, the redistribution layer 102, the lower passivation layer 110, the upper passivation layer 112, and the lower insulation layer 150. A through silicon via 50d may be included in the interposer substrate 52.

The semiconductor chip 200 may be disposed to face a first surface of the interposer substrate 52. The semiconductor chip 200 may be spaced apart from the first surface of the interposer substrate 52. The second upper conductive pattern 100 and the redistribution layer 102 may be formed on the first surface of the interposer substrate 52. The metal wiring 50b in the interposer substrate 52 may electrically connect to a portion of the second upper conductive pattern 100 and the redistribution layer 102. The first bump pad 130 may be disposed on the second upper conductive pattern 100.

The through silicon via 50d may be electrically connected to the second upper conductive pattern 100 and the redistribution layer 102 formed on the first surface of the interposer substrate 52. The through silicon via 50d may pass through the silicon-based substrate 50a of interposer substrate 52, and may extend toward the second surface of the interposer substrate 52, e.g., the through silicon via 50d may extend into the intermetal dielectric layers 50c to be electrically connected to metal wiring 50b therein.

The through silicon via 50d may include a metal. The through silicon via 50d may be formed in a through via hole passing through the silicon-based substrate 50a. An insulation spacer may be formed on a sidewall of the through via hole.

A second lower conductive pattern 54 contacting the through silicon via 50d may be formed on the second surface of the interposer substrate 52. A lower bump 70 may contact the second lower conductive pattern 54.

The semiconductor chip 200, the conductive bump 140, the redistribution layer 102, the lower passivation layer 110, the upper passivation layer 112, and the lower insulation layer 150 may be substantially the same as those described previously with reference to FIGS. 1 to 3, respectively.

A first upper conductive pattern 12 may be formed on the package substrate 10, and the first upper conductive pattern 12 may be disposed to face the second lower conductive pattern 54. The second lower conductive pattern 54 on the interposer substrate 52 and the first upper conductive pattern 12 on the package substrate 10 may be bonded to each other by the lower bump 70. That is, the lower bump 70 may be interposed between the first upper conductive pattern 12 and the second lower conductive pattern 54, so that the interposer substrate 52 and the package substrate 10 may be bonded to each other by the lower bump 70.

In example embodiments, as the wires shown in FIGS. 1 and 3 are replaced with the through silicon via 50d and the second lower conductive pattern 54, the semiconductor package may not include the wires. Therefore, a pad opening passing through the lower passivation layer 110 and the upper passivation layer 112 to expose a portion of the second portion of the redistribution layer 102 may not be formed. Thus, the lower passivation layer 110 and the upper passivation layer 112 may entirely cover the second portion of the redistribution layer 102.

Although not shown, an external connection member may further be included on a lower surface of the package substrate 10. For example, the semiconductor package may be mounted on an external system substrate or a main board through the external connection member. The external connection member may include a conductive material, e.g., copper (Cu), aluminum (Al), silver (Ag), tin (Sn), gold (Au), or solder.

Figure 5:
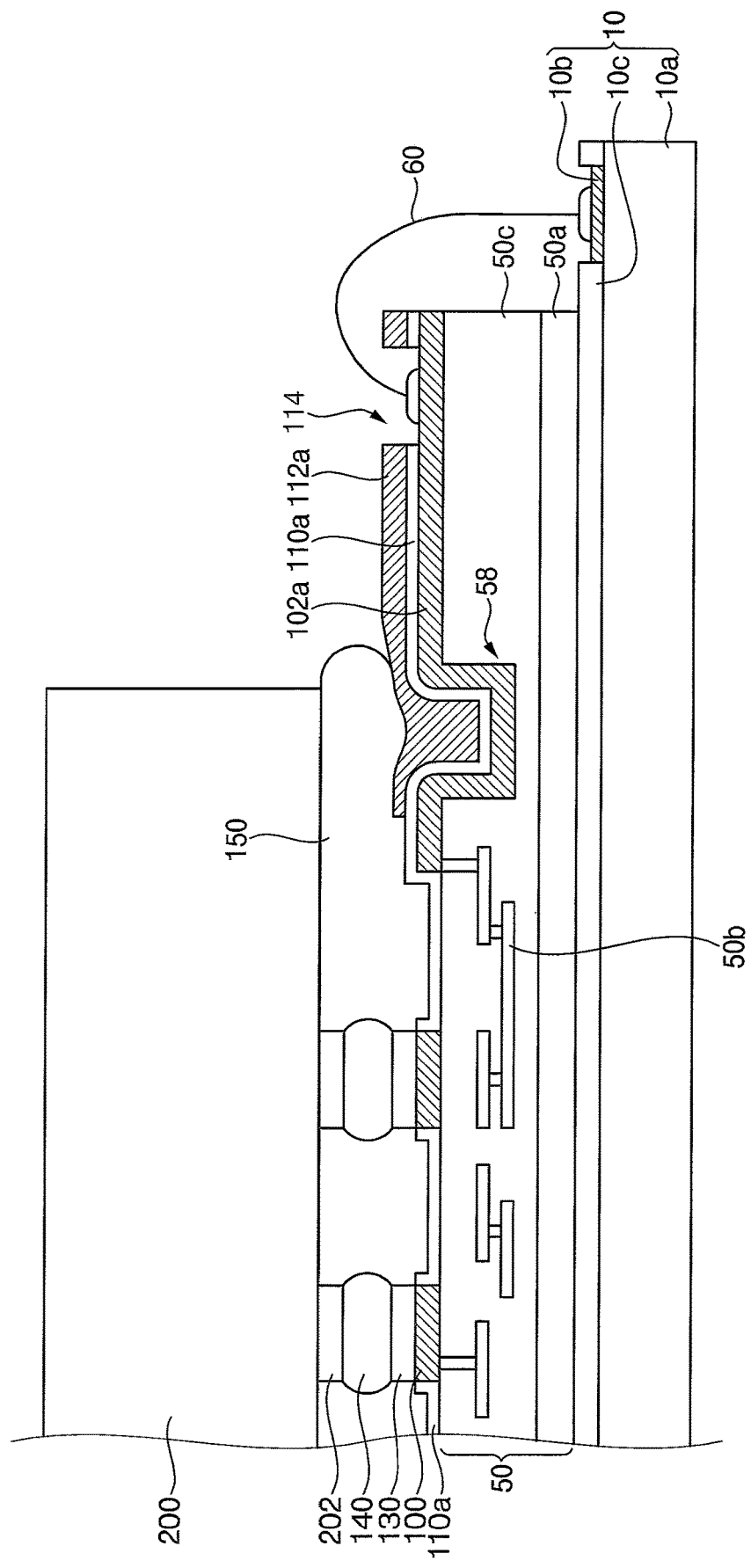
FIG. 5 is a cross-sectional view of a semiconductor package in accordance with example embodiments.
Figure 6:
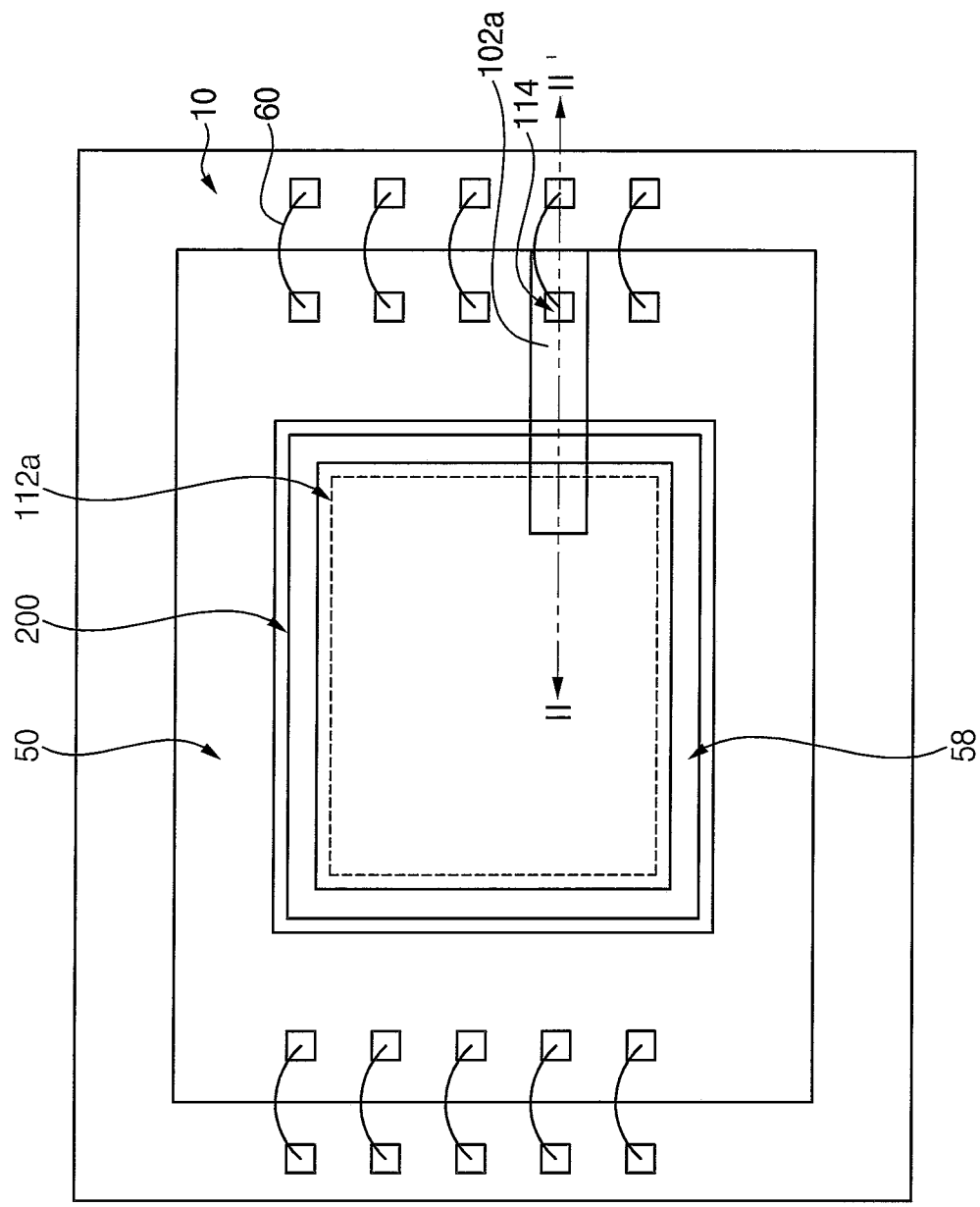
FIG. 6 is a plan view of a semiconductor package in accordance with example embodiments.

FIG. 5 is a cross-sectional view of a semiconductor package in accordance with example embodiments. FIG. 6 is a plan view of a semiconductor package in accordance with example embodiments. FIG. 5 is a cross-sectional view along line II-II' of FIG. 6. The semiconductor package in FIG. 5 is similar to or the same as the semiconductor package shown in FIG. 1, except for a trench included in the interposer substrate.

Referring to FIGS. 5 and 6, the semiconductor package may include the package substrate 10, the interposer substrate 50, the semiconductor chip 200, the conductive bump 140, a redistribution layer 102a, a lower passivation layer 110a, an upper passivation layer 112a, and the lower insulation layer 150.

The semiconductor chip 200 may be disposed to face the first surface of the interposer substrate 50. A trench 58 may be formed at the first surface of the interposer substrate 50. The trench 58 may be formed along a portion facing, e.g., overlapping, the edge of the semiconductor chip 200. Thus, the trench 58 may have a ring shape, in a plan view.

An inner space of the trench 58 may face at least an end portion of a portion facing the semiconductor chip 200 at the first surface of the interposer substrate 50. In example embodiments, the inner space of the trench 58 may face the edge of the semiconductor chip 200. In some example embodiments, a part of the inner space of the trench 58 may be disposed in a portion not facing the semiconductor chip 200, slightly deviating from a boundary of the portion facing the semiconductor chip 200.

After forming the redistribution layer 102*a* and the lower passivation layer 110*a* on sidewalls and a bottom surface of the trench 58, a space may remain in the trench 58. Therefore, a width, e.g., along a horizontal direction parallel to the upper surface of the package substrate 10, of the trench 58 may be greater than twice a sum of thicknesses of the redistribution layer 102*a* and the lower passivation layer 110*a*. In example embodiments, the width of the trench 58 may be about 2.5 times to about 5 times the sum of the thicknesses of the redistribution layer 102*a* and the lower passivation layer 110*a*.

The second upper conductive pattern 100 and the redistribution layer 102*a* may be formed on the first surface of the interposer substrate 50. The redistribution layer 102*a* disposed on the interposer substrate 50 may extend from a portion facing the lower surface of the semiconductor chip 200 to a portion not facing the semiconductor chip 200. The redistribution layer 102*a* may be formed on the upper surface of the interposer substrate 50 facing the lower surface of the semiconductor chip 200, the sidewalls and the bottom of the trench 58, and the upper surface of the interposer substrate 50 not facing the lower surface of the semiconductor chip 200. That is, the redistribution layer 102*a* may be conformally formed on the sidewalls and bottom of the trench 58.

The lower passivation layer 110*a* may be conformally formed on the first surface of the interposer substrate 50, a sidewall of the second upper conductive pattern 100, and a sidewall and an upper surface of the redistribution layer 102*a*. The lower passivation layer 110*a* may be conformally formed on the upper surface of the redistribution layer 102*a* disposed on the sidewalls and the bottom surface of the trench 58. After forming the lower passivation layer 110*a*, a space may remain in the trench 58.

The upper passivation layer 112*a* may be formed on the lower passivation layer 110*a* positioned on the upper surface of the redistribution layer 102*a*. The upper passivation layer 112*a* may cover a portion of the first portion of the redistribution layer 102*a* and the second portion of the redistribution layer 102*a*. The upper passivation layer 112*a* may fill the trench 58.

The redistribution layer 102*a* and the lower passivation layer 110*a* may be conformally formed on the trench 58, and the upper passivation layer 112*a* may be stacked on the lower passivation layer 110*a* to fill the trench 58. As the upper passivation layer 112*a* may be mostly positioned at an inner portion of the trench 58, a thickness of the upper passivation layer 112*a* protruding above the trench 58 may not be present or may be low.

In example embodiments, as the upper passivation layer 112*a* may be formed to fill the trench 58, a height of the upper surface of the upper passivation layer 112*a* around or over the trench 58 may be lower than a height of the upper surface of the upper passivation layer 112*a* spaced apart from the trench 58 and not facing the semiconductor chip (i.e., the fourth portion).

The upper passivation layer 112*a* may cover a portion of the first portion and the second portion of the redistribution layer 102*a*, so that the upper passivation layer 112*a* may protect the redistribution layer 102. That is, cracks in the redistribution layer 102*a* due to thermal stress applied to the redistribution layer 102*a* may be decreased by the upper passivation layer 112*a*.

A gap may be formed between the lower surface of the semiconductor chip 200 and the upper surface of the interposer substrate 50 in a direction perpendicular from the upper surface of the interposer substrate 50. The gap may have a first vertical height at a center portion where the redistribution layer 102*a* is not formed on the interposer substrate 50. The gap may have a second vertical height less than the first vertical height at a portion between the redistribution layer 102*a* not covered by the upper passivation layer 112*a* and the semiconductor chip 200. The gap may have a third vertical height less than the second vertical height at a portion between the redistribution layer 102*a* covered by the upper passivation layer 112*a* and the semiconductor chip 200.

As the height of the upper surface of the upper passivation layer around or over the trench 58 decreases, the third vertical height may increase as compared to the third vertical height at an interposer substrate without the trench (e.g., as in FIG. 1). For example, the third vertical height may be similar to the second vertical height. In example embodiments, the third vertical height may vary depending on a position of the upper passivation layer 112*a*.

By forming the trench 58, a difference between the third vertical height and the first vertical height and a difference between the third vertical height and the second vertical height may be decreased.

The lower insulation layer 150 may be formed on at least the lower passivation layer 110*a* to fill the gap. The lower insulation layer 150 may extend to the upper surface of the upper passivation layer 112*a* not facing the lower portion of the semiconductor chip 200.

As the third vertical height increases, the lower insulation layer 150 may easily fill the gap. Therefore, voids in the lower insulation layer 150 may be decreased. In example embodiments, the lower insulation layer 150 may be a non-conductive film (NCF) or an underfill resin.

Figure 7:
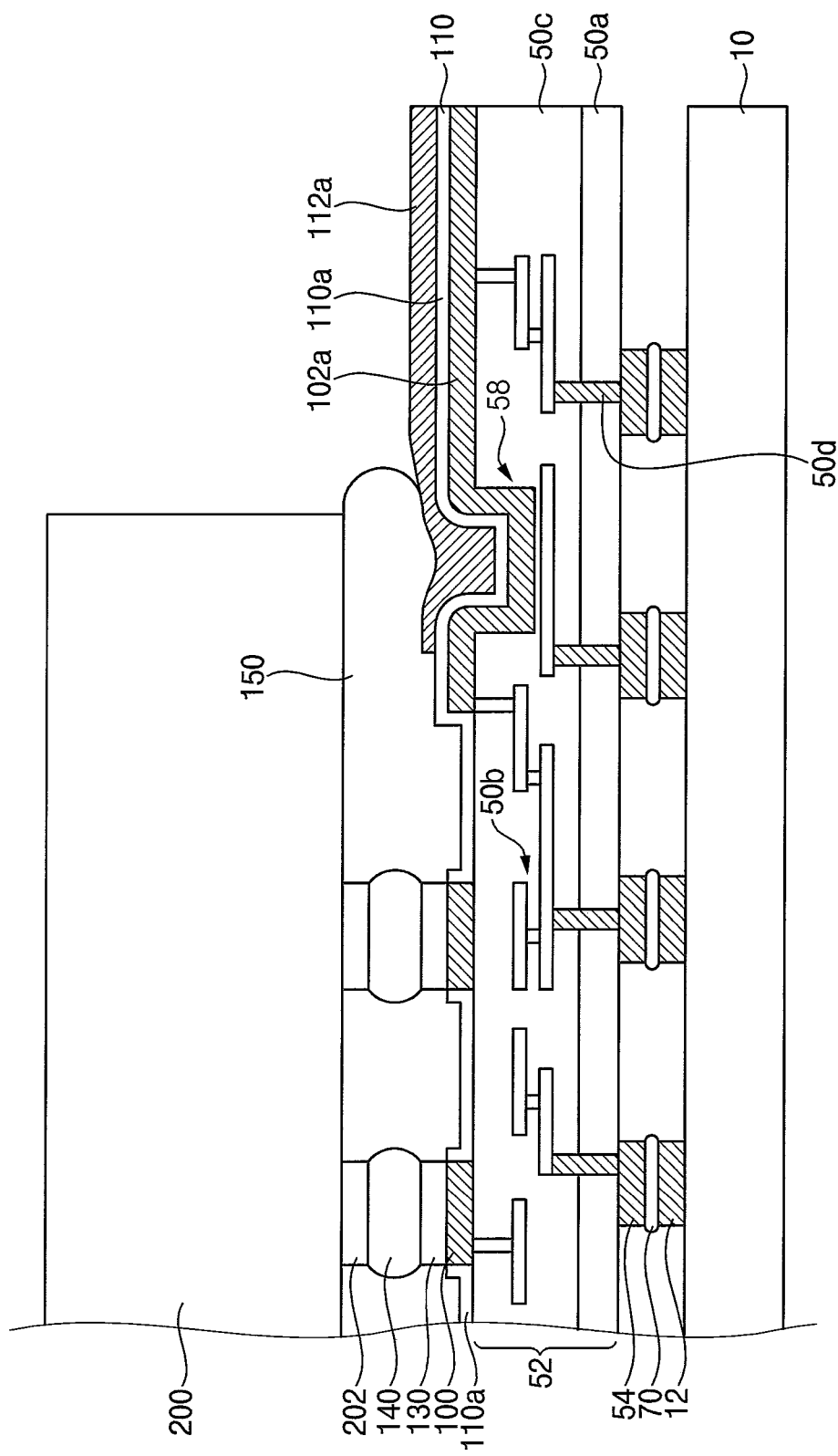
FIG. 7 is a cross-sectional view of a semiconductor package in accordance with example embodiments.

FIG. 7 is a cross-sectional view illustrating a semiconductor package in accordance with example embodiments. The semiconductor package in FIG. 7 is similar to or the same as the semiconductor package shown in FIG. 4, except for a through silicon via in an interposer substrate and a connection structure under the through silicon via. Therefore, redundant descriptions are omitted.

Referring to FIG. 7, the through silicon via 50*d* may be electrically connected to the second upper conductive pattern 100 and the redistribution layer 102*a* formed on the first surface of the interposer substrate 52. The through silicon via 50*d* may pass through the silicon-based substrate 50*a* of interposer substrate 52, and may extend to the second surface of the interposer substrate 52.

The second lower conductive pattern 54 contacting the through silicon via 50*d* may be formed on the second surface of the interposer substrate 52. The lower bump 70 may be formed on the second lower conductive pattern 54. As wires may be replaced with the through silicon via 50*d* and the second lower conductive pattern 54, the semiconductor package may not include the wires.

FIGS. 8 to 11 are cross-sectional views of stages in a method of manufacturing the semiconductor package in FIG. 1.

Figure 8:
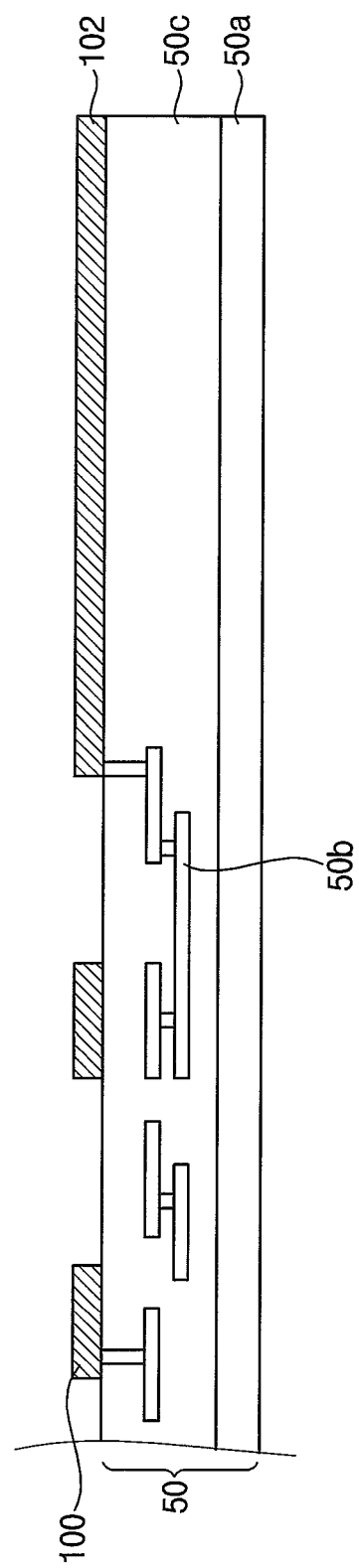
FIGS. 8 to 11 are cross-sectional views of stages in a method of manufacturing the semiconductor package in FIG. 1.

Referring to FIG. 8, the interposer substrate 50 may include the metal wirings 50*b* and the intermetal dielectric layers 50*c* on a silicon-based substrate 50*a*. The second upper conductive pattern 100 and the redistribution layer 102 may be formed on the first surface of the interposer substrate 50. The second upper conductive pattern 100 and the redistribution layer 102 may be formed by the same process. Therefore, the second upper conductive pattern 100 and the redistribution layer 102 may include the same metal material.

The second upper conductive pattern 100 may be disposed to face a lower surface of the semiconductor chip 200. The redistribution layer 102 may extend from a portion facing the lower surface of the semiconductor chip 200 (i.e., the first portion) to a portion not facing the semiconductor chip 200 (i.e., the second portion).

Figure 9:
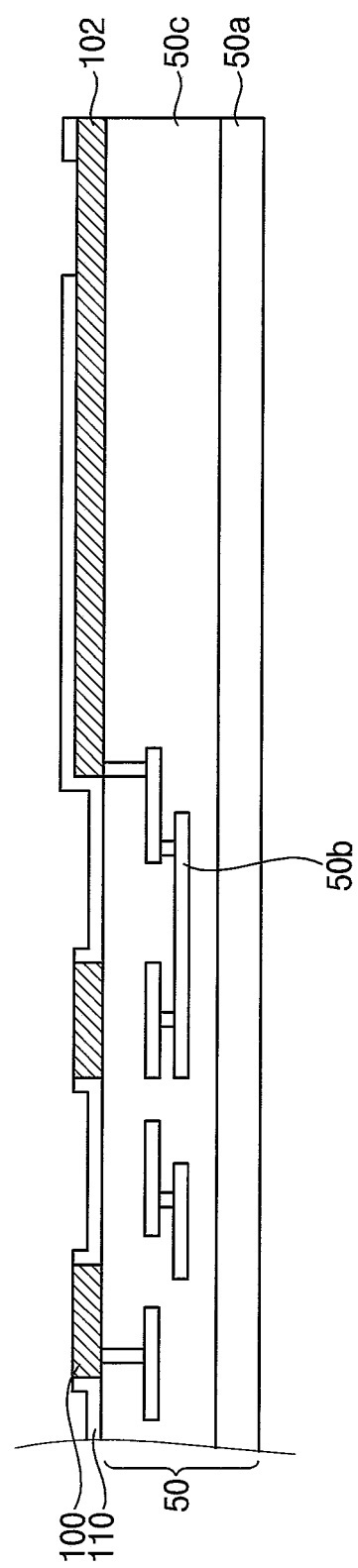

Referring to FIG. 9, the lower passivation layer 110 may be conformally formed on the first surface of the interposer substrate 50, a surface of the second upper conductive pattern 100, and sidewalls and an upper surface of the redistribution layer 102. The lower passivation layer 110 positioned on an upper surface of the second upper conductive pattern 100 may be selectively removed to expose the upper surface of the second upper conductive pattern 100. In some example embodiments, in the removing process, the lower passivation layer 110 corresponding to a pad opening may be removed together.

Figure 10:
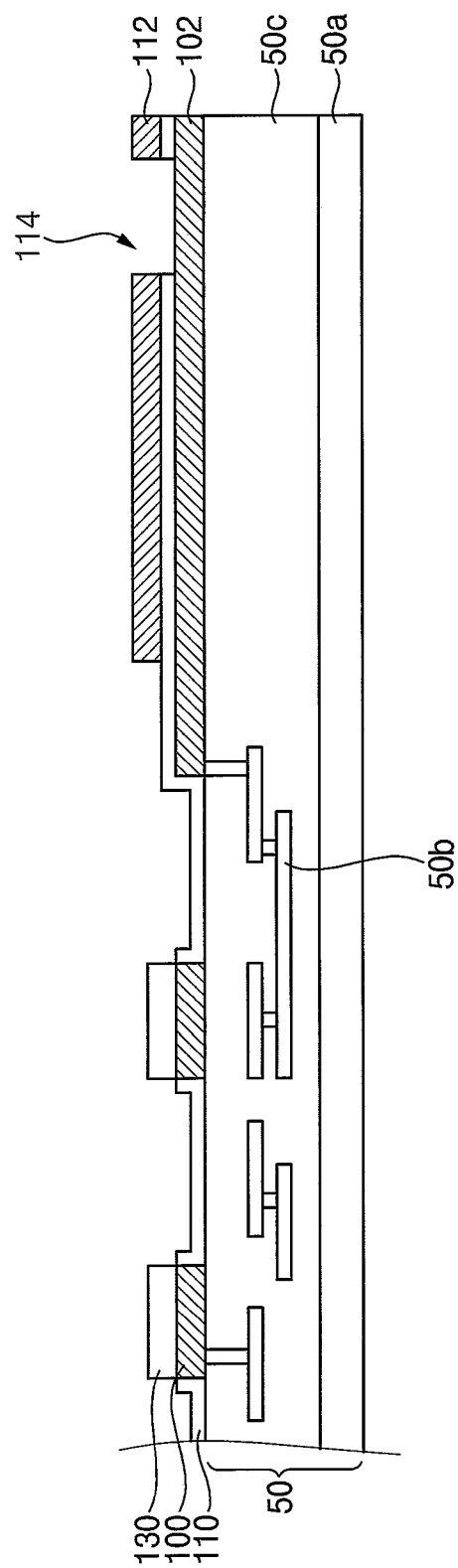

Referring to FIG. 10, the first bump pad 130 may be formed on the second upper conductive pattern 100, and the upper passivation layer 112 may be formed to cover the lower passivation layer 110 and the first bump pad 130 formed on the interposer substrate 50. The upper passivation layer 112 may be formed by a spin coating process.

The upper passivation layer 112 not positioned on the redistribution layer 102 may be removed. Further, the upper passivation layer 112 and the lower passivation layer 110 corresponding to the pad opening may be removed together to form the pad opening 114 exposing a portion of the redistribution layer 102. The removing process of a portion of the upper passivation layer 112 may include an exposure process and a development process.

The upper passivation layer 112 may be formed on the lower passivation layer 110 positioned on the upper surface of the redistribution layer 102. The upper passivation layer 112 may cover a portion of the first portion of the redistribution layer 102 and the second portion of the redistribution layer 102.

Figure 11:
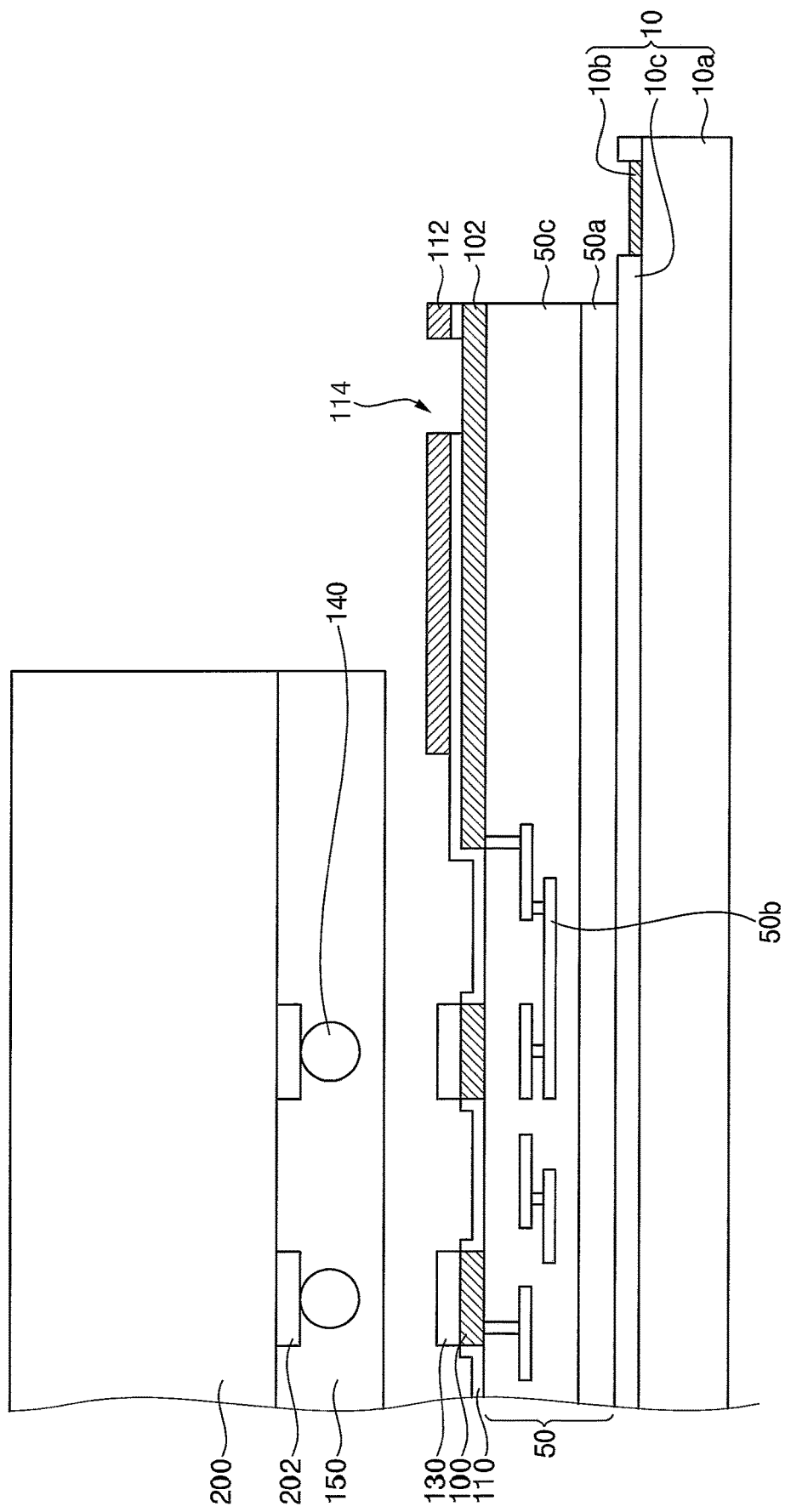

Referring to FIG. 11, the second surface of the interposer substrate 50 may be attached to an upper surface of the package substrate 10 using an adhesive, e.g., a die attach film (DAF). The conductive bump 140 may be formed on the second bump pad 202 of the semiconductor chip 200, and a non-conductive film (NCF) may be attached to the lower surface of the semiconductor chip 200, e.g., to cover the conductive bump 140, with the NCF being arranged over the first surface of the interposer substrate 50.

The conductive bump 140 of the semiconductor chip 200 may be compressed on the first bump pad 130, so that the conductive bump 140 of the semiconductor chip 200 may be bonded to the first bump pad 130 of the interposer substrate 50. Therefore, the NCF may fill a gap between the semiconductor chip 200 and the interposer substrate 50, and some NCF may be pushed out of the lower surface of the semiconductor chip 200. That is, when the conductive bump 140 is pushed toward the first bump pad 130, a portion of the NCF between the conductive bump 140 and the first bump pad 130 may be pushed away to allow direct contact between the conductive bump 140 and the first bump pad 130, i.e., so portions of the NCF define the lower insulation layer 150 that fills the gap between the semiconductor chip 200 and the interposer substrate 50 and may further be pushed to extend laterally beyond the semiconductor chip 200.

By the above process, as shown in FIG. 1, the lower insulation layer 150 including the NCF may be formed in the gap between the semiconductor chip 200 and the interposer substrate 50. The lower insulation layer 150 may protect the conductive bump 140, the semiconductor chip 200, and the interposer substrate 50.

In a bonded structure of the semiconductor chip 200 and the interposer substrate 50, a structure in which the redistribution layer 102, the lower passivation layer 110, and upper passivation layer 112 are stacked may be formed on the interposer substrate 50 facing the end portion of the lower surface of the semiconductor chip 200. Thus, the lower insulation layer 150 may partially cover an upper surface of the upper passivation layer 112.

In some example embodiments, as shown in FIG. 3, an underfill resin may fill the gap between the semiconductor chip 200 and the interposer substrate 50. In this case, before filling the underfill resin, the conductive bumps 140 of the semiconductor chip 200 may be bonded to the first bump pads 130 of the interposer substrate 50. Therefore, in the bonded structure of the semiconductor chip 200 and the interposer substrate 50, the underfill resin may be distributed to fill the gap, and then cured to form the lower insulation layer 150. In this case, the semiconductor package shown in FIG. 3 may be manufactured.

The redistribution layer 102 may be protected by the lower insulation layer 150 and/or the upper passivation layer 112. Therefore, even if thermal stress is applied to the redistribution layer 102 during a reliability testing process or during operating of the semiconductor package, the thermal stress of the redistribution layer 102 may be decreased by the lower insulation layer 150 and/or the upper passivation layer 112. Thus, cracks in the redistribution layer 102 may be decreased.

The wires 60 may be formed to be electrically connected with the redistribution layer 102 exposed by the pad opening 114 and the first upper conductive pattern 10b on the package substrate 10 by a wire bonding process.

In some example embodiments, as shown in FIG. 4, a through silicon via may be included in the interposer substrate. In this case, the wire bonding process between the redistribution layer and the lower package substrate may not be performed. The second lower conductive pattern on the second surface of the interposer substrate and the first upper conductive pattern on the upper surface of the package substrate may be bonded each other using a lower bump, so that the semiconductor package shown in FIG. 4 may be manufactured.

Figure 12:
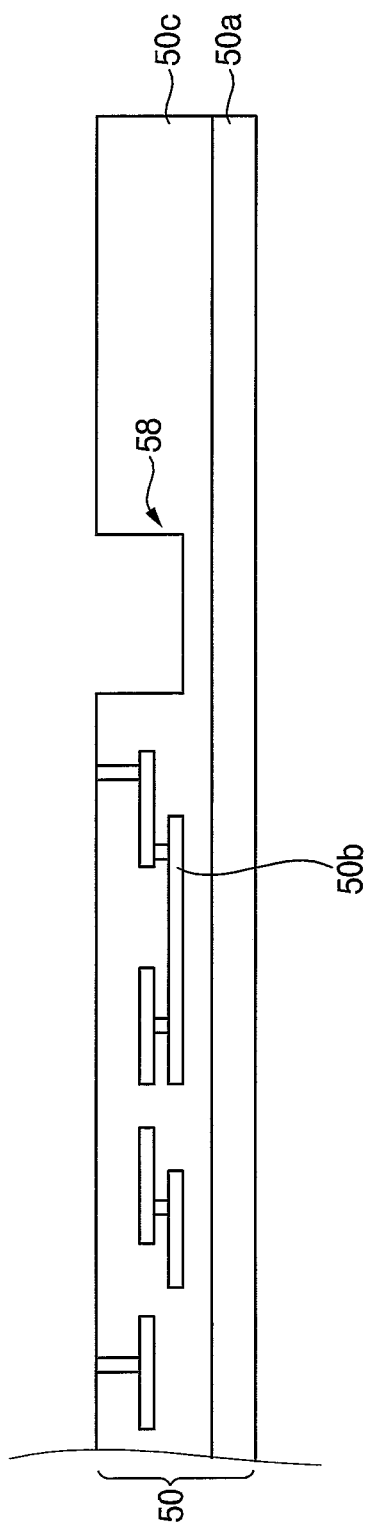
FIGS. 12 to 14 are cross-sectional views of stages in a method of manufacturing the semiconductor package in FIG. 5.
Figure 13:
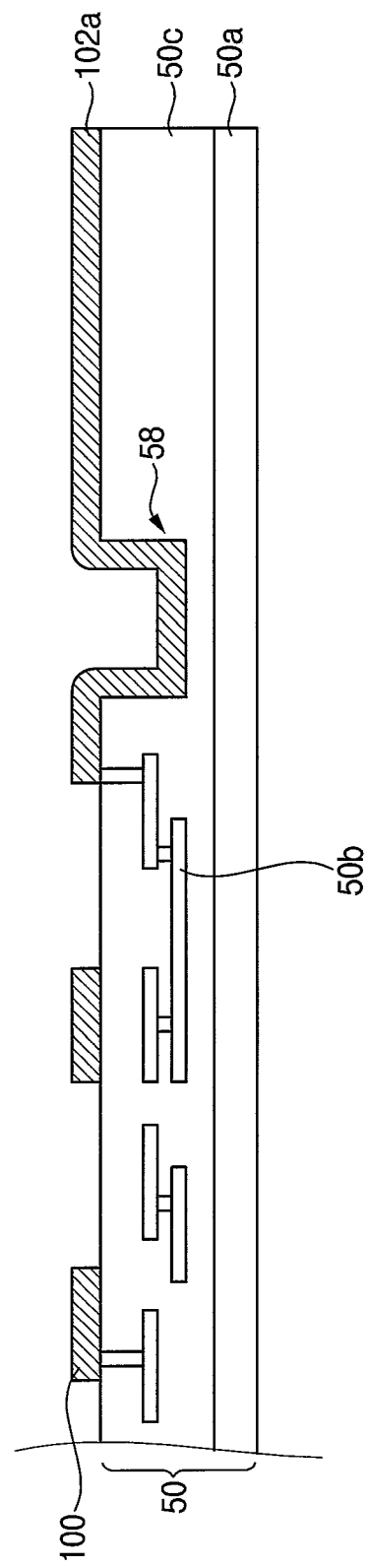
Figure 14:
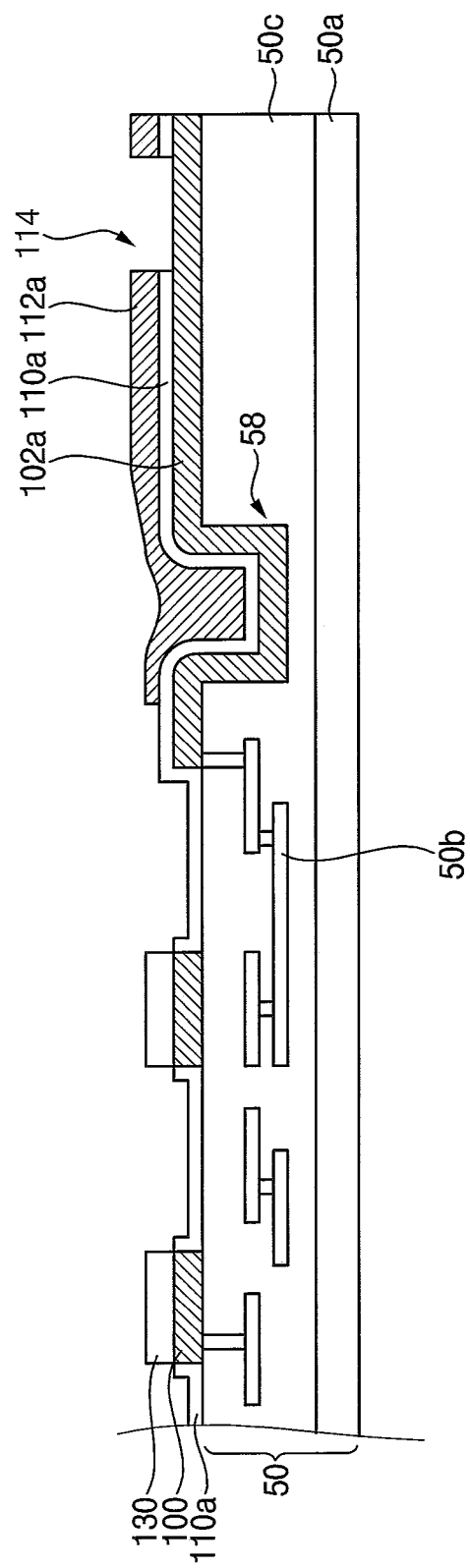

FIGS. 12 to 14 are cross-sectional views of stages in a method of manufacturing the semiconductor package shown in FIG. 5.

Referring to FIG. 12, the interposer substrate 50 may include the metal wirings 50b and the intermetal dielectric layers 50c on a silicon-based substrate 50a. A portion of the first surface of the interposer substrate 50 may be etched to form the trench 58. The trench 58 may be formed along an edge of the semiconductor chip 200 to face the edge of the semiconductor chip 200. Therefore, the trench 58 may have a ring shape, in a plan view.

Referring to FIG. 13, the second upper conductive pattern 100 and the redistribution layer 102a are formed on the interposer substrate 50 including the trench 58. The second upper conductive pattern 100 and the redistribution layer 102a may be formed by the same process. Therefore, the second upper conductive pattern 100 and the redistribution layer 102a may include the same metal material.

The second upper conductive pattern 100 may be disposed to face the lower surface of the semiconductor chip 200. The redistribution layer 102a may extend from a portion facing the lower surface of the semiconductor chip 200 (i.e., the first portion) to a portion not facing the semiconductor chip 200 (i.e., the second portion). Further, the redistribution layer 102a may be conformally formed on sidewalls and bottom of the trench 58.

Referring to FIG. 14, the lower passivation layer 110a may be conformally formed on the first surface of the interposer substrate 50, a surface of the second upper conductive pattern 100, and a surface of the redistribution layer 102a. The lower passivation layer 110a may be conformally formed on the redistribution layer 102a positioned on a surface of the trench 58.

The lower passivation layer 110a disposed on an upper surface of the second upper conductive pattern 100 may be selectively removed to expose the upper surface of the second upper conductive pattern 100. The first bump pad 130 may be formed on the second upper conductive pattern 100.

The upper passivation layer 112a may be formed to cover the lower passivation layer 110a and the first bump pad 130 on the interposer substrate 50. The upper passivation layer 112a not positioned on the redistribution layer 102a may be removed. Further, the upper passivation layer 112a and the lower passivation layer 110a corresponding to the pad opening portion may be removed to form the pad opening 114 exposing a portion of the redistribution layer 102a.

The upper passivation layer 112a may cover a portion of the first portion of the redistribution layer 102a and the second portion of the redistribution layer 102a. The upper passivation layer 112a may fill the trench 58.

Thereafter, processes substantially the same as or similar to those illustrated with reference to FIG. 11 may be performed, so that the semiconductor chip 200 and the interposer substrate 50 may be bonded to each other. Also, the lower insulation layer 150 may be formed in the gap between the semiconductor chip 200 and the interposer substrate 50.

As described above, the upper passivation layer 112a may fill the trench 58, and thus a vertical height of the gap above the trench 58 may be relatively increased compared to a case of a structure having no trench. Therefore, processes for forming the lower insulation layer 150 in the gap may be more easily performed.

By way of summation and review, a redistribution layer including metal may be disposed on the first surface of the interposer substrate, and the redistribution layer may be electrically connected to a semiconductor chip. However, cracks in the redistribution layer may be frequently generated due to thermal stress.

In contrast, example embodiments provide a semiconductor package with reduced defects, where the redistribution layer is protected by a lower insulation layer and/or the upper passivation layer. That is, in the semiconductor package in accordance with example embodiments, a passivation layer may be formed on the redistribution layer, and the passivation layer may extend from a portion facing a lower edge of the semiconductor chip to a portion not facing the semiconductor chip. Thus, cracks in the redistribution layer due to thermal stress may be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a substrate;
   an upper conductive pattern and a redistribution layer on a first surface of the substrate;
   a semiconductor chip spaced apart from the first surface of the substrate, the semiconductor chip facing the first surface of the substrate;
   a conductive bump bonding between the semiconductor chip and the upper conductive pattern, the conductive bump electrically connecting the semiconductor chip and the upper conductive pattern; and
   an upper passivation layer on the redistribution layer, the upper passivation layer overlapping only an edge of a lower surface of the semiconductor chip.

2. The semiconductor package as claimed in claim 1, wherein the redistribution layer includes:
   a first portion facing the lower surface of the semiconductor chip; and
   a second portion not facing the semiconductor chip, the first portion and the second portion of the redistribution layer being in contact with each other.

3. The semiconductor package as claimed in claim 2, wherein the upper passivation layer covers a part of the first portion of the redistribution layer, the upper passivation layer not extending under the semiconductor chip beyond the redistribution layer.

4. The semiconductor package as claimed in claim 1, wherein the upper passivation layer includes a photosensitive solder resist layer.

5. The semiconductor package as claimed in claim 1, wherein the upper passivation layer has a thickness of about 4 μm to about 6 μm.

6. The semiconductor package as claimed in claim 1, wherein a width of an overlap region between the upper passivation layer and the lower surface of the semiconductor chip is less than 1 mm.

7. The semiconductor package as claimed in claim 1, further comprising a lower passivation layer between the upper passivation layer and the redistribution layer, the lower passivation layer extending conformally on the first surface of the substrate, a sidewall of the upper conductive pattern, and a sidewall and an upper surface of the redistribution layer, and the lower passivation layer having a first thickness less than a second thickness of the upper passivation layer.

8. The semiconductor package as claimed in claim 7, wherein the lower passivation layer includes silicon oxide, silicon nitride, or silicon oxynitride.

9. The semiconductor package as claimed in claim 7, wherein the first thickness of the lower passivation layer is about 0.3 μm to about 0.8 μm.

10. The semiconductor package as claimed in claim 1, further comprising a trench on the first surface of the substrate, the trench extending along and facing the edge of the lower surface of the semiconductor chip.

11. The semiconductor package as claimed in claim 10, wherein the redistribution layer is conformal on sidewalls and a bottom of the trench, the upper passivation layer being on the redistribution layer to fill the trench.

12. The semiconductor package as claimed in claim 1, further comprising a lower insulation layer filling a gap between the semiconductor chip and the first surface of the substrate, the lower insulation layer contacting a sidewall and an upper surface of the upper passivation layer.

13. The semiconductor package as claimed in claim 12, wherein the lower insulation layer includes a non-conductive film or an underfill resin.

14. A semiconductor package, comprising:
an interposer substrate;
an upper conductive pattern and a redistribution layer on a first surface of the interposer substrate;
a first bump pad on the upper conductive pattern;
a semiconductor chip spaced apart from the first surface of the interposer substrate, the semiconductor chip facing the first surface of the interposer substrate;
a second bump pad on the semiconductor chip;
a conductive bump between the first bump pad and the second bump pad, the conductive bump bonding between the semiconductor chip and the upper conductive pattern, and the conductive bump electrically connecting the semiconductor chip and the upper conductive pattern;
a lower passivation layer extending conformally on the first surface of the interposer substrate, a sidewall of the upper conductive pattern, and sidewalls and an upper surface of the redistribution layer; and
an upper passivation layer on the redistribution layer, the upper passivation layer overlapping only an edge of a lower surface of the semiconductor chip, and a width of portion of the upper passivation layer overlapping the edge of the lower surface of the semiconductor chip being less than 1 mm.

15. The semiconductor package as claimed in claim 14, wherein the upper passivation layer has a thickness of about 4 μm to about 6 μm.

16. The semiconductor package as claimed in claim 14, wherein the lower passivation layer has a thickness of about 0.3 μm to about 0.8 μm.

17. The semiconductor package as claimed in claim 14, further comprising a trench on the first surface of the interposer substrate, the trench extending along a portion of the interposer substrate facing the edge of the semiconductor chip.

18. The semiconductor package as claimed in claim 17, wherein a width of the trench is greater than twice a sum of thicknesses of the redistribution layer and the lower passivation layer.

19. A semiconductor package, comprising:
a package substrate including a lower conductive pattern;
an interposer substrate on the package substrate;
an upper conductive pattern and a redistribution layer on a first surface of the interposer substrate;
a semiconductor chip spaced apart from the first surface of the interposer substrate, the semiconductor chip facing the first surface of the interposer substrate;
a conductive bump bonding between the semiconductor chip and the upper conductive pattern, the conductive bump electrically connecting the semiconductor chip and the upper conductive pattern;
an upper passivation layer on the redistribution layer, the upper passivation layer acing overlapping only an edge of a lower surface of the semiconductor chip;
a lower insulation layer filling a gap between the semiconductor chip and the first surface of the interposer substrate, the lower insulation layer contacting a sidewall and an upper surface of the upper passivation layer; and
a connection member electrically connecting the interposer substrate and the package substrate.

20. The semiconductor package as claimed in claim 19, further comprising a trench on the first surface of the interposer substrate, the trench extending along a portion of the interposer substrate facing the edge of the lower surface of the semiconductor chip.

* * * * *